United States Patent [19]
Tarneja et al.

[11] B 3,933,527
[45] Jan. 20, 1976

[54] FINE TUNING POWER DIODES WITH IRRADIATION

[75] Inventors: Krishan S. Tarneja; John Bartko; Joseph E. Johnson, all of Pittsburgh, Pa.

[73] Assignee: Westinghouse Electric Corporation, Pittsburgh, Pa.

[22] Filed: Mar. 9, 1973

[21] Appl. No.: 339,699

[44] Published under the Trial Voluntary Protest Program on January 28, 1975 as document no. B 339,699.

[52] U.S. Cl. .................. 148/1.5; 29/578; 148/186; 357/91
[51] Int. Cl.² ...................................... H01L 21/263
[58] Field of Search ....... 148/1.5; 250/49.5; 29/578; 317/235; 357/91

[56] References Cited
UNITED STATES PATENTS

| | | | |
|---|---|---|---|
| 2,911,533 | 11/1959 | Damask | 148/1.5 X |
| 3,272,661 | 9/1966 | Tomono et al. | 148/1.5 |
| 3,533,857 | 10/1970 | Mayer et al. | 148/1.5 |
| 3,736,192 | 5/1973 | Tokuyama et al. | 148/1.5 |

OTHER PUBLICATIONS
Clark et al., "Isochronal Annealing of P and N-Type Silicon Irradiated at 80°K," Phil. Mag., Nov. 1969, 20(167), pp. 951, 958.

*Primary Examiner*—L. Dewayne Rutledge
*Assistant Examiner*—J. M. Davis
*Attorney, Agent, or Firm*—C. L. Menzemer

[57] ABSTRACT

Diodes of a particular type are fine tuned with irradiation to optimize the reverse recovery time while minimizing forward voltage drop and providing more uniform electrical characteristics. The initial and desired minority carrier lifetimes in the anode region of the type are determined as a function of forward voltage drop and reverse recovery time, and the minority carrier radiation damage factor is determined for a desired type of diode and radiation source. The radiation dosage to achieve the desired carrier lifetime with the radiation source is thereafter determined from the function $1/\tau = 1/\tau_o + K\phi$, where $\tau$ is the desired minority carrier lifetime, $\tau_o$ is the initial minority carrier lifetime, K is the determined minority carrier radiation damage factor and $\phi$ is the radiation dosage. A major surface and preferably the major surface adjoining the anode region of the diodes is then irradiated with the radiation source to the determined radiation dosage. Preferably, the radiation dosage is between about $1 \times 10^{12}$ and $5 \times 10^{13}$ e/cm², with electron radiation of intensity between 1 and 3 Mev.

4 Claims, 5 Drawing Figures

FINE TUNING POWER DIODES WITH IRRADIATION

FIELD OF THE INVENTION

The present invention relates to the making of semiconductor devices and particularly diodes.

BACKGROUND OF THE INVENTION

A semiconductor diode is a two-electrode semiconductor device, having an anode and a cathode, which has marked unidirectional electrical characteristics. A junction diode is a semiconductor diode whose asymmetrical voltage-ampere characteristics are manifested as a result of a PN junction formed at the transition between N-type and P-type regions within the semiconductor wafer. This junction may be either diffused, grown or alloyed.

A high power diode generally requires that one of the regions, usually the anode region, have a low impurity concentration, e.g., $1 \times 10^{14}$ to $1 \times 10^{16}$ atoms per cm$^3$. This enables the device to withstand a high reverse blocking voltage without breakdown or punch-through by permitting a wide space charge region. A difficulty with such devices has been the long reverse recovery time upon breakover into the conduction mode. That is, the time needed for the device to reestablish the blocking mode upon breakdown or punch-through. Such recovery time is primarily dependent upon the recombination time of the minority carriers in the highly resistive region, which as previously stated is usually the anode region.

It has been proposed to reduce the reverse recovery time of diodes by irradiation, see application Ser. No. 339,242 filed Mar. 8, 1973, now U.S. Pat. No. 3,809,582, and assigned to the same assignee as the present invention. The irradiation damages the atomic lattice causing the formation within the atomic lattice of large numbers of defects corresponding to energy levels within the forbidden energy gap between the valence and conduction energy bands of the semiconductor. These energy states increase the recombination rate of the minority carriers without correspondingly increasing the carrier generation rate. Thus, the reverse recovery time of the diode can be substantially reduced without correspondingly increasing the forward voltage drop and other electrical characteristics.

The difficulty with such radiation techniques has been the erratic effect of irradiation upon the electrical characteristics. That is, the effect of a given dosage of radiation from a radiation source on the electrical characteristics cannot be predicted from device to device. Specifically, it has been known that minority carrier lifetime before and after irradiation can be given by the relationship:

$1/\tau = 1/\tau_o + K_L\phi$ where $\tau$ is the post-irradiation minority carrier lifetime;
$\tau_o$ is the pre-irradiation minority carrier lifetime;
$\phi$ is the radiation dosage; and
$K_L$ is the minority carrier lifetime damage factor.

However, the damage factor $K_L$ varies widely from device to device. The damage factor has been known to vary with the type and concentration of impurities, temperature of application, and type and intensity of radiation, as well as the bulk of the semiconductor crystal.

Irradiation has not therefore been considered useful for fine correction of the electrical characteristics of devices. Rather, it was considered useful to substantially change certain electrical characteristics without corresponding changes in other electrical characteristics, where the devices were subsequently tested and classified or subsequently annealed. See also patent application Ser. No. 324,718, filed Jan. 18, 1973, now U.S. Pat. No. 3,881,963, Ser. No. 283,684, filed Aug. 25, 1972, now U.S. Pat. No. 3,872,493, Ser. No. 283,685, filed Aug. 25, 1972, now U.S. Pat. No. 3,840,887, Ser. No. 285,165, filed Aug. 31, 1972, now abandoned, Ser. No. 343,070, filed Mar. 30, 1973, now U.S. Pat. No. 3,877,997, Ser. No. 354,620, filed Apr. 25, 1973, now abandoned, and Ser. No. 337,967, filed Mar. 5, 1973, now U.S. Pat. No. 3,881,968, all of which are assigned to the same assignee as the present invention.

SUMMARY OF THE INVENTION

It has been found contrary to previous experience, that irradiations performed with electron radiation with an intensity between about 1 and 3 Mev provide minority carrier radiation damage factors with small variation from batch to batch of a particular device. Thus, by performing an irradiation study on a batch of a particular device type and radiation source, a minority carrier damage factor can be obtained which can be used to determine radiation dosage suitable to provide the desired minority carrier lifetime in other batches of the particular device with the radiation source.

A method for fine tuning a particular type of diode is provided by first determining the minority carrier radiation damage factor for the particular type of diode and particular radiation source. The nominal minority carrier lifetime initially present in the anode region of the particular diode is also determined as well as the desired minority carrier lifetime in the anode region to achieve the desired reverse recovery time and forward voltage drop in the final diode.

The radiation dosage to achieve the desired nominal minority carrier lifetime is thus determined using the relationship:

$1/\tau = 1/\tau_o + K\phi$ where $\tau$ is the desired nominal minority carrier lifetime;
$\tau_o$ is the measured nominal minority carrier lifetime;
$K$ is the minority carrier lifetime damage factor; and
$\phi$ is the irradiation dosage.

The determined radiation dosage is then applied to the type of diode with the radiation source used in determination of the minority carrier lifetime damage factor. This is typically done by exposing major surface adjoining the anode region of a batch of the type diode to the radiation source. Preferably the radiation dosage is between about $1 \times 10^{12}$ and $5 \times 10^{13}$ electrons per centimeter squared and most desirably between about $5 \times 10^{12}$ and $2 \times 10^{13}$ electrons per centimeter squared.

Other details, objects and advantages of the invention will become apparent from the following description of the presently preferred embodiments and presently preferred methods of practicing the invention.

BRIEF DESCRIPTION OF THE DRAWINGS

In the accompanying drawings, the preferred embodiments of the invention and present preferred methods of practicing the invention are illustrated in which.

DESCRIPTION OF THE PREFERRED EMBODIMENTS

Figure 1:
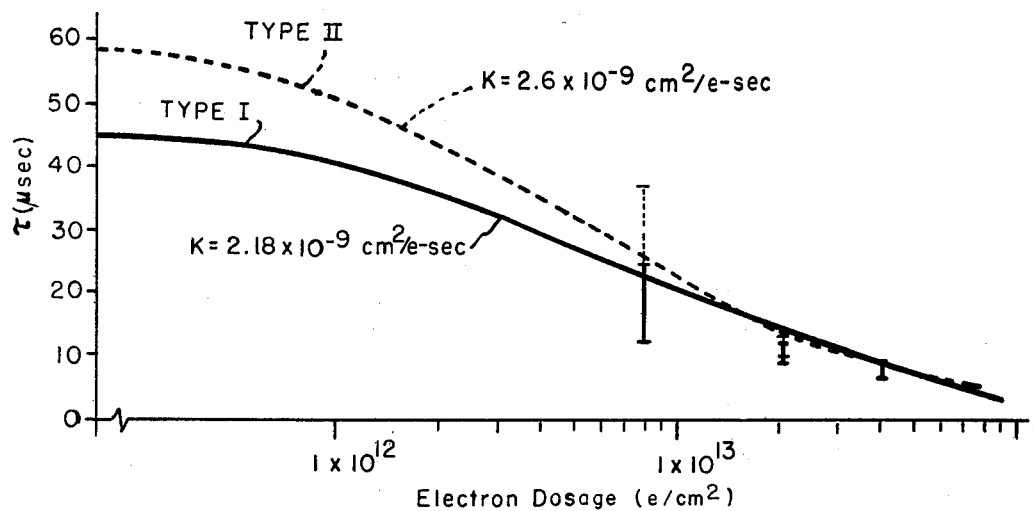
FIG. 1 is a graph showing determinations of the minority carrier damage factors of particular types of diodes in accordance with the present invention.
Figure 4:
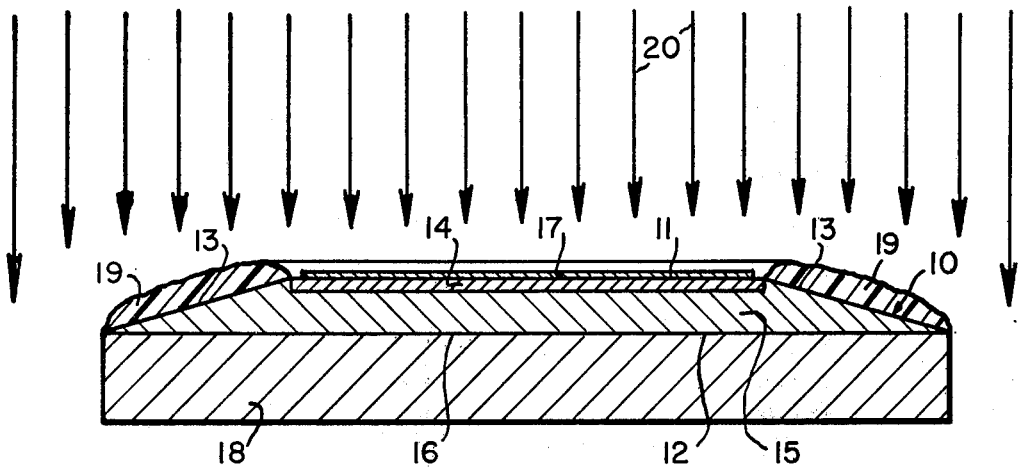
FIG. 4 is an elevational view in cross-section of a high power junction diode being irradiated in accordance with one step of the present invention.

Referring to FIG. 1, the minority carrier lifetime damage factor was determined for two types of diodes using an electron radiation source of 2 Mev intensity. The diode were as shown in FIG. 4 and hereinafter described. Over 100 devices of one type of diode (hereinafter called "TYPE I") and over 50 devices of the other type of diode (hereinafter called "TYPE II") were used in the determination. Diodes of Type I were divided into four Groups 1–4 and diodes of Type II were divided into two Groups 5–6, and irradiated as follows:

| Group | Type of Diode | Initial Radiation Dosage (e/cm$^2$) | Accumulation-Subsequent Radiation Dosage (e/cm$^2$) |
|---|---|---|---|
| 1 | I | 8 × 10$^{12}$ | 1.3 × 10$^{13}$ |
| 2 | I | 7 × 10$^{13}$ | — |
| 3 | I | 4.6 × 10$^{13}$ | — |
| 4 | I | 8.4 × 10$^{13}$ | — |
| 5 | II | 8 × 10$^{12}$ | 2 × 10$^{13}$ |
| 6 | II | 7 × 10$^{13}$ | — |

The apparatus used for these irradiations is similar to that shown in FIG. 5 and described in detail hereinafter.

Measurements of forward voltage drop ($V_f$), minority carrier lifetime ($\tau$) [by open circuit decay method], and reverse recovery time ($t_{rr}$) were made on each device initially and after each radiation dosage.

FIG. 1 is a plot of average minority carrier lifetime ($\tau_{OCD}$) versus the corresponding electron dosages. Curve A is for Type I diodes and Curve B is for Type II diodes. The spread of measured values is indicated; it should, however, be noted that the measured values had a Gaussian distribution about the average with approximately 60 to 70% of values within the standard deviation from the average. Further, noteworthy is the decrease in deviation of lifetime measurements after irradiation with increases in radiation dosages. This decrease in deviation is to be expected for a substantially constant radiation dosage factor because as the radiation dosage increases, the $K\phi$ becomes increasingly more significant in the relationship $1/\tau = 1/\tau_o + K\phi$.

From FIG. 1 the minority carrier lifetime radiation damage factor can be determined for the various radiation dosages of interest by the slope of the curves. For the Type I devices, it is shown that in the dosage range from about 1 × 10$^{12}$ to 5 × 10$^{13}$ e/cm$^2$ the minority carrier lifetime radiation dosage factor is substantially constant at about 2.18 × 10$^{-9}$ cm$^2$/e-sec. And for the Type II devices, it is shown that in the dosage range from about 1 × 10$^{12}$ to 5 × 10$^{13}$ e/cm$^2$ the minority carrier lifetime radiation dosage factor is substantially constant at about 2.6 × 10$^{-9}$ cm$^2$/e-sec. It should be noted that this constancy is remarkable considering that Groups were done at different times by different operators.

Figure 2:
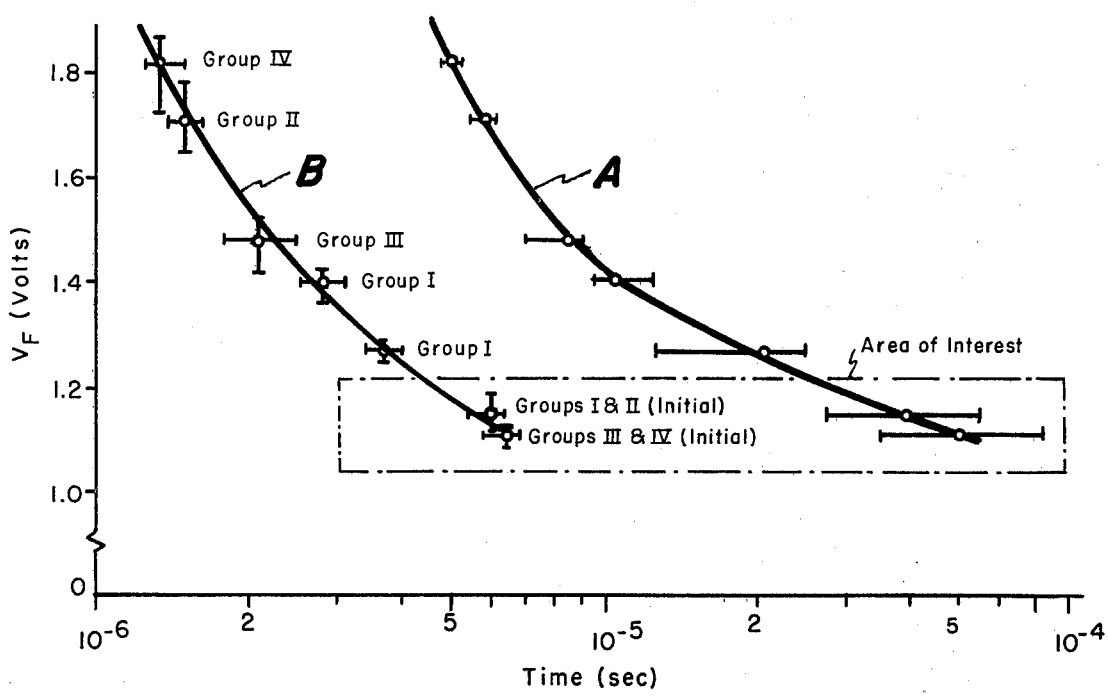
FIG. 2 is a graph showing the relationships of reverse recovery time ($t_{rr}$) and minority carrier lifetime ($\tau$) to forward voltage drop ($V_f$) for a particular type of diode to be fine tuned using the present invention.
Figure 3:
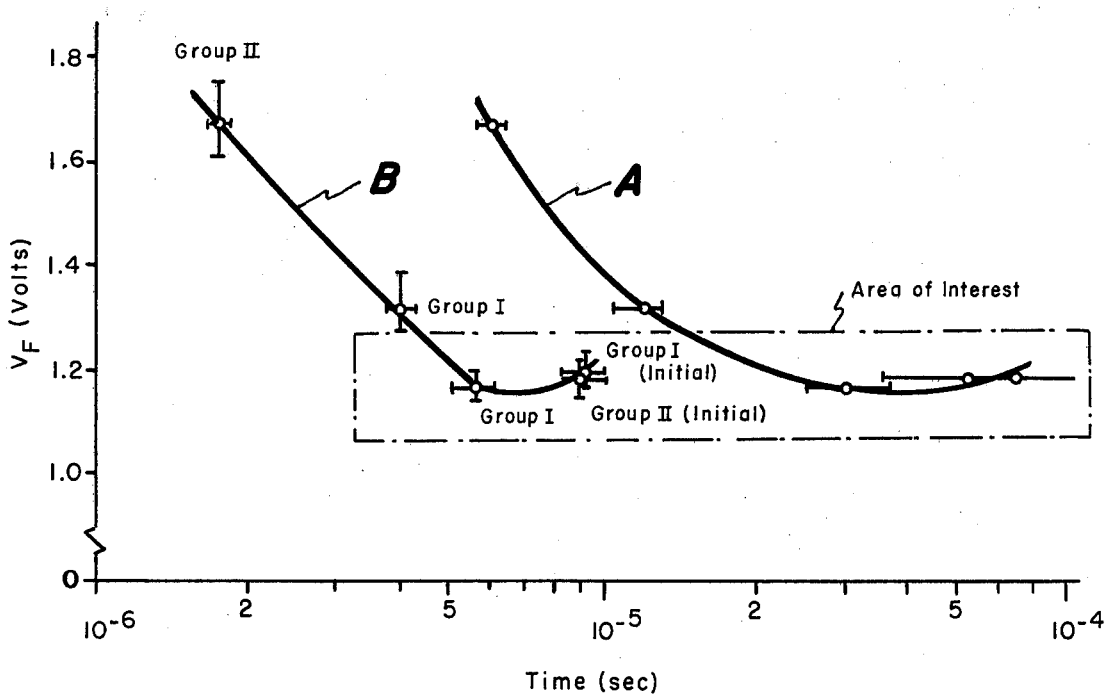
FIG. 3 is a graph showing the relationships of reverse recovery time ($t_{rr}$) and minority carrier lifetime ($\tau$) to forward voltage drop ($V_f$) for another particular type of diode to be fine tuned using the present invention.

The other data obtained from the measurements were plotted in FIGS. 2 and 3. Curves A of FIGS. 2 and 3 plot average minority carrier lifetime ($\tau_{OCD}$) versus average forward voltage drop ($V_f$) for Type I and Type II devices, respectively. And curves B of FIGS. 2 and 3 plot average reverse recovery time versus average forward voltage drop ($V_f$) for Type I and Type II devices, respectively. Again the spread of measured values is indicated and the measured values had a Gaussian distribution.

From these plots the nominal minority carrier lifetime ($\tau_o$) of the diodes initially and the relationship of $\tau_o$ to the reverse recovery time can be readily seen. Further, the nominal minority carrier lifetime desired in the anode region of the types of diodes ($\tau$) can be readily established given the desired reverse recovery time and tolerable forward voltage drop of the types of diodes. It should be noted that the area of interest for fine tuning has been dotted in and is determined by the marketable limits of forward voltage drop which can be tolerated.

From this information, the radiation dosage from the given electron radiation dosage to obtain the desired nominal minority carrier lifetime can be determined from the relationship $1/\tau = 1/\tau_o + K\phi$
where $\tau$ is the established nominal minority carrier lifetime;
$\tau_o$ is the measured nominal minority carrier lifetime;
$K$ is the minority carrier radiation damage factor; and
$\phi$ is the electron radiation dosage.

Figure 5:
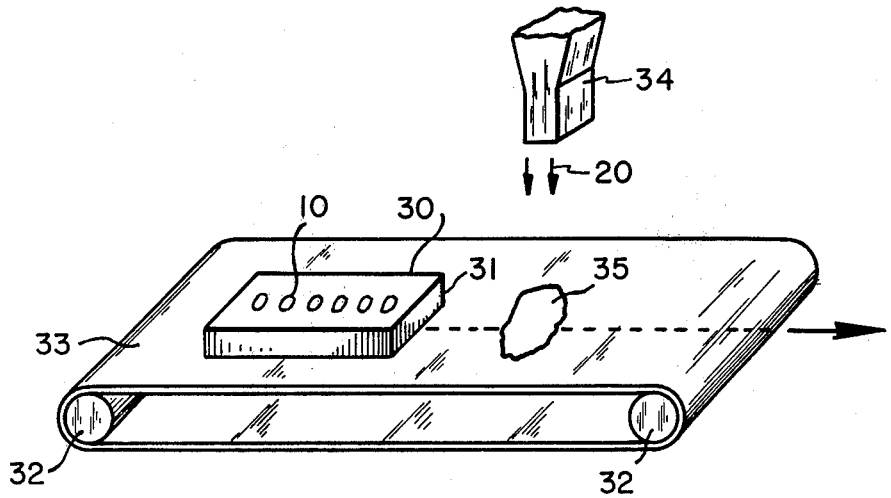
FIG. 5 is a perspective view of apparatus for performance of irradiation on a batch of a particular type of junction diode as shown in FIG. 4.

Thereafter, diodes of each type of diode can be fine tuned simply by irradiating them as shown in FIGS. 4 and 5. Preferably, the radiation dosage is between about 1 × 10$^{12}$ and 5 × 10$^{13}$ e/cm$^2$, with electron radiation of intensity between 1 and 3 Mev.

Referring to FIG. 4, a junction silicon diode wafer or body 10 is shown having opposed major surfaces 11 and 12 and curvilinear side surfaces 13. Diode body 10 has cathode region 14 and anode region 15 of impurities of opposite conductivity type adjoining major surfaces 11 and 12, respectively. Formed at the transition between regions 14 and 15 in the interior of body 10 is PN junction 16.

To provide electrical connections to the diode body, metal contacts 17 and 18 make ohmic contact to cathode region 14 and anode region 15 at major surfaces 11 and 12, respectively. To reduce channeling effects and atmospheric effects on the diode operation, side surfaces 13 are beveled by lap etching and are coated with a suitable passivating resin 19 such as a silicone, epoxy or varnish composition.

Irradiation is performed on diode body 10 by positioning major surface 11 for exposure to the given electron radiation source between 1 and 3 Mev intensity. The diode body is thereafter irradiated by electron radiation 20 from the given source to the dosage level determined for fine tuning.

Referring to FIG. 5, apparatus is shown for performing the irradiation on the junction diode body 10 as shown in FIG. 4 with electron radiation. A conveyor belt 33 is moved around roller or pulley means 32 which is rotated by a suitable power source (not shown). A 2 Mev Van de Graaff Accelerator 34 is positioned to direct electron radiation 20 perpendicular to conveyor belt 33 to strike it at 35.

A series of junction diode bodies 10 are positioned in planar array on a water cooled tray 30 having an electrostatically attractive periphery 31. Bodies 10 are positioned with major surface 11 adjoining cathode region 14 facing upwardly as shown in FIG. 1. To perform the irradiation, the electron dosage rate is measured by use of a Faraday cup in conjunction with an Elcon Charge Integrator and the radiation level adjusted to the desired dosage. Tray 30 with the bodies 10 in place is then placed on the conveyor belt 33 and moved by the conveyor in the direction of the arrow through the electron radiation 20. The electron radiation dosage can also be controlled by the speed of the conveyor belt 33 as well as the intensity level of the radiation source.

The diodes of each particular type of diode are thus fine tuned with irradiation to optimize the reverse recovery time while minimizing forward voltage drop. The reverse recovery time ($t_{rr}$) can be reduced from 7–8 $\mu$ sec. to 5–5.5 $\mu$ sec. without alteration of any significance to forward voltage drop ($V_f$). The deviation of the forward voltage drop and reverse recovery time also becomes more uniform by irradiation. That is, the deviation of these electrical characteristics from device to device is less after irradiation than before irradiation. The present invention therefore is of substantial value in quality control.

While presently preferred embodiments have been shown and described, it is distinctly understood that the invention may be otherwise variously performed within the scope of the following claims. For example, the invention has been particularly described with respect to silicon semiconductor devices. It is contemplated that the present invention has utility with other semiconductor materials such as germanium and gallium arsenide, although the particular radiation and intensity thereof and the effectiveness of the invention will doubtless vary with the semiconductor material.

What is claimed is:

1. A method of fine tuning a diode of a type of diodes comprising the steps of:
  A. determining the minority carrier radiation damage factor for the type of diode with a given electron radiation source of intensity between about 1 and 3 Mev;
  B. measuring the nominal minority carrier lifetime in the anode region of the type of diode;
  C. establishing the nominal minority carrier lifetime desired in the anode region of the type of diode;
  D. thereafter determining the radiation dosage from the given electron radiation source to obtain the desired nominal minority carrier lifetime by the relationship $1/\tau = 1/\tau_o + K\phi$
  where
  $\tau$ is the established nominal minority carrier lifetime,
  $\tau_o$ is the measured nominal minority carrier lifetime,
  $K$ is the minority carrier radiation damage factor, and
  $\phi$ is the electron radiation dosage; and
  E. irradiating a major surface of at least one diode of the type of diodes with the given radiation source to the determined radiation dosage.

2. A method of fine tuning a diode of a type of diodes as set forth in claim 1 wherein:
  the major surface irradiated adjoins the anode region of the diode.

3. A method of fine tuning a diode of a type of diodes as set forth in claim 1 wherein:
  the desired minority carrier lifetime is such that the radiation dosage is between about $1 \times 10^{12}$ and $5 \times 10^{13}$ electrons per centimeter squared.

4. A method of fine tuning a diode of a type of diodes as set forth in claim 3 wherein:
  the radiation dosage is between about $5 \times 10^{12}$ and $2 \times 10^{13}$ electrons per centimeter squared.

* * * * *